United States Patent [19]

Pande

[11] Patent Number: 4,529,996
[45] Date of Patent: Jul. 16, 1985

[54] INDIUM PHOSPHIDE-BORON PHOSPHIDE HETEROJUNCTION BIPOLAR TRANSISTOR

[75] Inventor: Krishna P. Pande, Columbia, Md.

[73] Assignee: Allied Coporation, N.Y.

[21] Appl. No.: 484,762

[22] Filed: Apr. 14, 1983

[51] Int. Cl.³ .......................................... H01L 29/161
[52] U.S. Cl. ...................................... 357/16; 357/56; 357/61
[58] Field of Search ........................ 357/30, 16, 56, 61

[56] References Cited

U.S. PATENT DOCUMENTS

| 3,054,936 | 9/1962  | Williams et al.   | 317/235   |
| 3,321,682 | 5/1967  | Flatley et al.    | 317/237   |
| 4,160,258 | 7/1979  | Dauson            | 357/61 X  |
| 4,214,926 | 7/1980  | Katsuto et al.    | 148/175   |
| 4,254,429 | 3/1981  | Yamazaki          | 357/61 X  |
| 4,357,622 | 11/1982 | Magdo et al.      | 357/44    |
| 4,481,523 | 11/1984 | Osaka             | 357/16    |

FOREIGN PATENT DOCUMENTS 1009581 7/1974 Japan .
2072182 12/1975 Japan .

OTHER PUBLICATIONS

Kroemer H., "Heterostructure Bipolar Transistors and Integrated Circuits", *Proceedings of the IEEE*, vol. 70, No. 1, Jan. 1982.

Kroemer H., "Theory of a Wide-Gap Emitter Transistor", *Proceeding of the IRE*, vol. 45, 1957.

Fank et al., "Device Development for mm-Waves", *Microwave Journal*, Jun. 1979.

Dumke et al., "GaAs-GaAlAs Heterojunction Transistor for High Frequency Operation", Solid State Electronics, vol. 15, 1972.

*Primary Examiner*—Martin H. Edlow
*Attorney, Agent, or Firm*—James R. Ignatowski; Russel C. Wells

[57] ABSTRACT

A heterojunction bipolar transistor having an n− type epitaxial indium phosphide collector layer grown on a semi-insulating indium phosphide substrate with an n+ buried layer, a p− type indium phosphide base and an epitaxial, n− type boron phosphide wide gap emitter. The p− type base region is formed by ion implantation of magnesium ions into the collector layer. The transistor is applicable to millimeter wave applications due to the high electron mobility in the indium phosphide base. The wide gaps of both the boron phosphide (2.2 eV) and indium phosphide (1.34 eV) permit operation up to 350° C. The transistor is easily processed using metal organic-chemical vapor deposition (MO-CVD) and standard microelectronic techniques.

21 Claims, 7 Drawing Figures

INDIUM PHOSPHIDE-BORON PHOSPHIDE HETEROJUNCTION BIPOLAR TRANSISTOR

BACKGROUND OF THE INVENTION

1. Field of the Invention

The invention is related to the field of bipolar transistors and in particular to a bipolar indium phosphide transistor having a boron phosphide wide gap emitter.

2. Prior Art

Group III-V compound semiconductor transistors are known in the art. Although the solid state industry has been concentrating on the development of gallium arsenide transistors, indium phosphide and boron phosphide transistors separately have been given some attention. Williams et al in U.S. Pat. No. 3,054,936 discloses boron phosphide p-n junction transistors. However, transistors made with boron phosphide alone have low channel mobility and are not suitable for high frequency (microwave) applications. Additionally Katsuto et al in U.S. Pat. No. 4,214,926 disclose doping techniques for boron phosphide films grown on silicon substrates and Japanese Pat. Nos. 1009-582 and 2072-182 describe boron phosphide-silicon heterojunction transistors. Flatley et al in U.S. Pat. No. 3,321,682 disclose diffusion processing techniques for gallium phosphide and indium phosphide while Frank, Crowley and Berenz in their article "Device Development for mm-Waves" Microwave Journal, June 1979, describe the advantages of indium phosphide devices for millimeter wave applications. This article deals mainly with two terminal devices and Gunn Oscillators for millimeter (mm) wave applications.

The theory of wide gap emitters is presented by Kroemer in his article "Theory of a Wide Gap Emitter for Transistors" *Proceedings of the IRE*, November 1957. Kroemer discloses that the "injection defecit" can be reduced by several orders of magnitude if the emitter has a higher band gap than the base region. Kroemer in a second article "Heterostructure Bipolar Transistors and Integrated Circuits," *Proceedings of the IEEE*, Vol. 70 No. 1 January 1982 and Dumke, Woodall and Rideout in their article "GaAs-GaAlAs Heterojunction Transistor for High Frequency Operations" *Solid State Electronics* Vol. 15 1972 disclose the use of wide gap emitters for high frequency application. Both articles are primarily directed to gallium arsenide technology but Kroemer indicates the principle may be applicable to lattice matched III/V compound semiconductor heterosystems.

The invention is a novel indium phosphide-boron phosphide heterojunction bipolar transistor with a wide gap emitter.

SUMMARY OF THE INVENTION

The indium phophide-boron phosphide heterojunction bipolar transistor has a epitaxial n− type indium phosphide collector deposited on the surface of a semiinsulating indium phosphide substrate. A buried n+ indium phosphide layer is formed between the collector layer and the substrate to reduce the collector series resistance. A p− type base region is formed in the upper surface of the collector layer by ion implantation of magnesium or beryllium. A wide gap n− type boron phosphide emitter and an n+ type boron phosphide emitter contact region are grown over the surface of the p− type base using a low temperature metal organic chemical vapor deposition technique. Collector and base contact regions are formed in the collector layer by ion implantation of silicon and magnesium respectively. The transistor is completed by depositing metal electrodes over the respective collector, base and emitter contact regions through openings in an insulating layer overlaying the surface of the transistor.

The use of a wide gap boron phosphide emitter in the indium phosphide-boron phosphide heterojunction bipolar transistor offers the advantage of a higher transconductance leading to millimeter wave applications. Other advantages include high breakdown voltage, low leakage and small parasitic capacitance and resistance. This and other advantages of the indium phosphide-boron phosphide transistor will become more apparent from reading the specifications in connection with the appended figures.

DETAILED DESCRIPTION OF THE INVENTION

Figure 1:
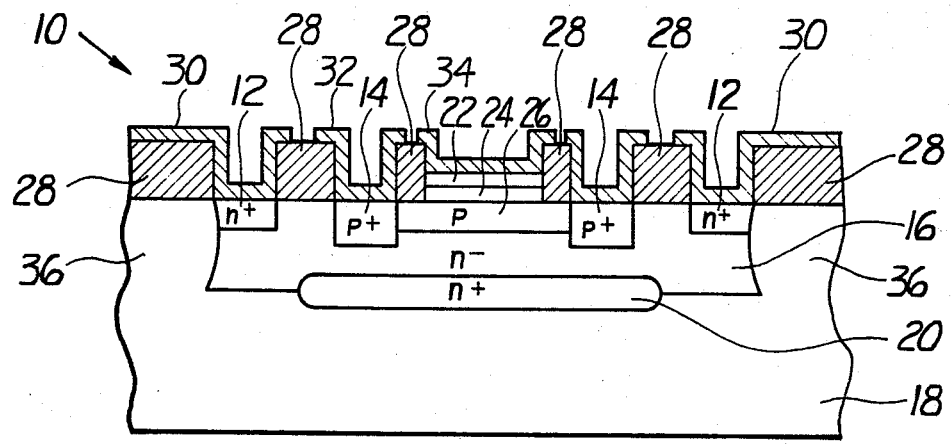
FIG. 1 is a simplified (not to scale) cross sectional view of the transistor.

The details of the indium phosphide bipolar transistor having a wide gap emitter are shown in FIG. 1. Referring to FIG. 1 the transistor 10 has an epitaxial collector layer 16 grown on a semi-insulating indium phosphide substrate 18 and includes an n+ indium phosphide collector contact region 12 about its periphery and a buried n+ layer 20 formed at the interface between the collector layer 16 and the substrate 18. The buried n+ layer 20 reduces the collector series resistance, reduces the interface effects of the collector layer 16 with the substrate 18 and inhibits the out diffusion of iron (Fe) from the substrate 18 to the collector layer 16. A p− indium phosphide base region 26 and a p+ indium phosphide base contact regions 14 are implanted in the central region of the n− indium phosphide layer 16 as shown.

An epitaxial n− type boron phosphide emitter 24 is grown over the p− type indium phosphide region 26 created by implantation in the n− type indium phosphide collector layer 16. An n+ boron phosphide (BP) emitter contact region 22 is deposited over the epitaxial n− type boron phosphide wide gap emitter 24. An insulating layer 28 having openings exposing the collector contact region 12, base contact region 14, and emitter contact region 22 is deposited over the top surface of the transistor. Electrical contact to the collector contact region 12, base contact region 14 and emitter contact region 22 is made by evaporated metal alloy electrodes 30, 32, and 34 respectively. Isolation of the transistor 10 may be achieved by implanting boron (B) in the region 36 surrounding the active elements or by mesa etching as is known in the art.

The wide gap emitter bipolar transistor shown in FIG. 1 has potential applications in microwave communications. It can be used as an active component in low noise receivers and medium power amplifiers. Due to the wide gap emitter, the transistor also offers excellent high speed switching in digital circuits. The ability to integrate the wide gap emitter bipolar transistor with optoelectronic devices, such as indium gallium arsenide laser diodes, photodetectors and light emitting (LED) diodes, fabricated on a common semi-insulating indium phosphide substrate offers the possibility of optical communication with giga-bit rates.

Figure 2:
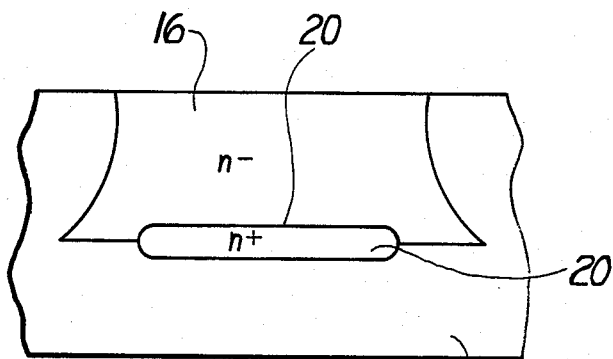
FIGS. 2 through 5 are simplified cross sectional view of the transistor at various stages in the fabrication process.

The fabrication procedure for the wide gap emitter bipolar transistor will now be explained with reference to FIGS. 1 through 5. Referring first to FIG. 2, the buried n+ layer 20 and N− type collector layer 16 are epitaxially grown on the semi-insulating indium phosphide substrate 18 using metal-organic chemical vapor deposition (MO-CVD) techniques similar to that described in the paper by K. P. Pande and A. Seabaugh "Preparation of Device Quality GaAs Using Plasma-Enhanced MO-CVD Technique" presented at the Electrochemical Society Conference "III–IV Opto-Electronics and Device Related Processes" May 1983. The substrate 18 has a thickness of approximately 100 micrometers permitting rapid dissipation of the heat generated during amplification. The buried n+ layer 20 may be formed by reacting phosphine with triethylindium and using sulphur chloride ($S_2Cl_2$) as the dopant source in a MO-CVD system. The n+ buried layer is grown in selectively etched areas of the semi-insulating substrate. The buries n+ layer 20 is grown to a thickness from 1 to 2 micrometers and has a carrier concentration of approximately 2 to $5 \times 10^{18}$ cm$^{-3}$. In a like manner the n− type indium phosphide collector layer 16 is epitaxially grown over the buried n+ layer 20. The indium phosphide collector layer 16, by nature, is of the n− type and its carrier concentration can be adjusted to $2 \times 10^{15}$ cm$^{-3}$ using sulfer chloride as the dopant source. The collector layer 16 is grown to a thickness between 0.5 and 1.0 micrometers to reduce the transit time of the carriers drifting through the collector junction. The doping is intentionally kept low to minimize the collector capacitance ($C_c$).

Figure 3:
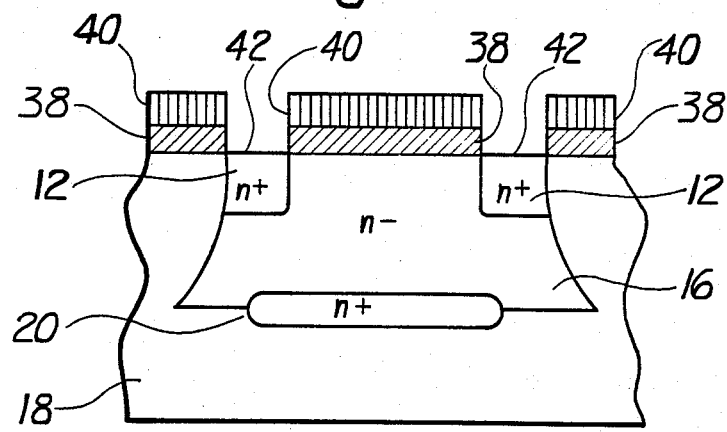

Referring now to FIG. 3, the collector layer 16 is coated with a silicon dioxide ($SiO_2$) layer 38 grown by plasma enhanced CVD techniques approximately 2000 Å thick and overlayed with a 1 micrometer thick film of photoresist 40. The photoresist 40 and silicon dioxide layer are then processed using conventional photolithography techniques to expose a surface area 42 of the collector layer 16 corresponding to the collector contact region 12. The exposed surface area 42 is then implanted with silicon (Si+) to form the n+ collector contact region 12. During this implantation the base, base contact, and emitter regions 26, 14 and 24 respectively are protected by the silicon dioxide layer 38 and photoresist film 40. The collector contact region 12 has a carrier concentration of about 2 to $5 \times 10^{18}$ cm$^{-3}$.

Figure 4:
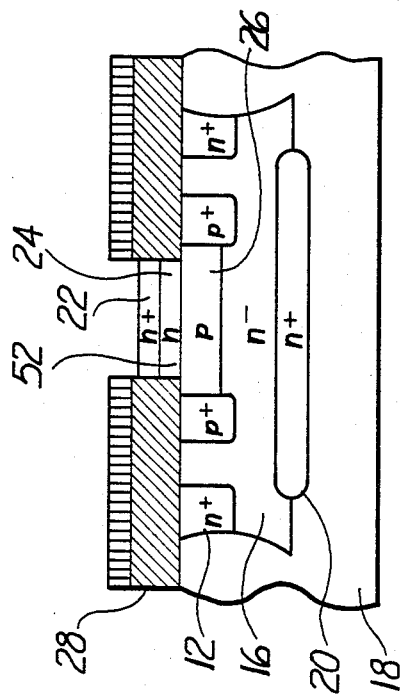

The remainder of the silicon dioxide layer 38 and photoresist film 40 are then removed and a second silicon dioxide layer 44 (approximately 500 angstroms) and photoresist film 46 are deposited over the surface of collector layer 16. The photoresist film 46 and silicon dioxide layer 44 are then processed using known lithography techniques to expose a surface area 48 of the collector layer 16 corresponding to the base contact region 14 as shown in FIG. 4. The central collector region is then implanted with high energy (200 keV) magnesium (Mg) or beryllium (Be) impurity ions at a dose of approximately $8 \times 10^{12}$ cm$^{-2}$ through the silicon dioxide layer 44 and photoresist film 46 to create the p-type indium phosphide base region 26 having a carrier concentration of approximately 6 to $8 \times 10^{17}$ cm$^{-3}$. The implantation energy is then reduced to approximately 40 keV and the dose increased to $1 \times 10^{14}$ cm$^{-2}$ ions to create the p+ base contact region 14 in the base region 26 under the exposed surface area 48 having a carrier concentration of greater than $1 \times 10^{18}$ cm$^{-3}$. The lower implantation energy is used for the p+ base contact region 14 so that the impurity ions with high dose cannot penetrate the silicon dioxide layer 44 and photoresist film 46 covering the base region.

Figure 5:
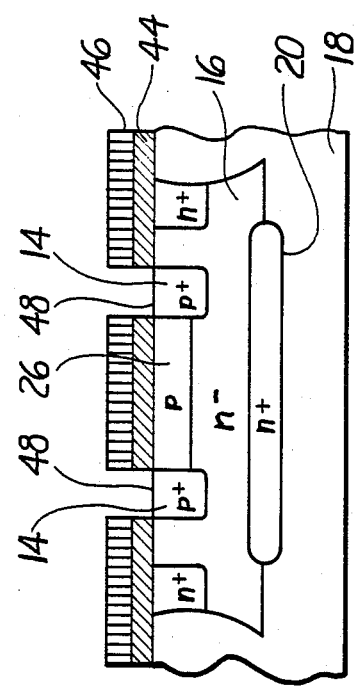

After implanting the p+ type base contact region 14, the remainder of the silicon dioxide layer 44 and photoresist film are again removed and the substrate annealed for a short time by transient radiation and capless annealing techniques to remove the implant damage. Next the silicon dioxide layer 28 is again deposited over the whole substrate and etched to expose a surface area 52 of the base region 26 corresponding to the emitter region 24 as shown in FIG. 5. A heterojunction n− type boron phosphide wide gap emitter 24 is then grown over the exposed surface area 52 of the base region 26 by vapor phase reaction of triethyl boron (liquid) or trimethyl boron (gas) with phosphine. Hydrogen may be used as a carrier gas permitting the deposition to be achieved at 500° C. or lower temperatures. Alternatively the n− type boron phosphide emitter 24 may be deposited by chemically reacting phosphine and diborane at temperatures greater than 500° C. The partial pressure of the phosphine is controlled to produce a carrier concentration of approximately 1 to $2 \times 10^{18}$ cm$^{-3}$ in the wide gap boron phosphide emitter 24.

An n+ boron phosphide emitter contact region 22 subsequently grown over the n− boron phosphide emitter 24. Like with the n− boron phosphide emitter 24, the partial pressure of the phosphine is controlled to produce the n+ boron phosphide emitter contact region 24 having a carrier concentration of greater than $10^{19}$ cm$^3$. If desired the layers can be doped with $S_2 Cl_2$ to achieve this doping density.

Openings are then etched through the silicon dioxide layer 28 to expose the collector contact region 12 and base contact region 14 as shown in FIG. 1. Electrodes 30 and 34 are then formed by thermally evaporating a gold-germanium-nickel alloy over the collector contact region 12 and emitter contact region 22 respectively. Electrode 32 is formed by thermally evaporating a gold-zinc-platinum alloy over the base contact region 14. An interdigitated contact scheme can be used for the emitter region to reduce current crowding effects.

Figure 6:
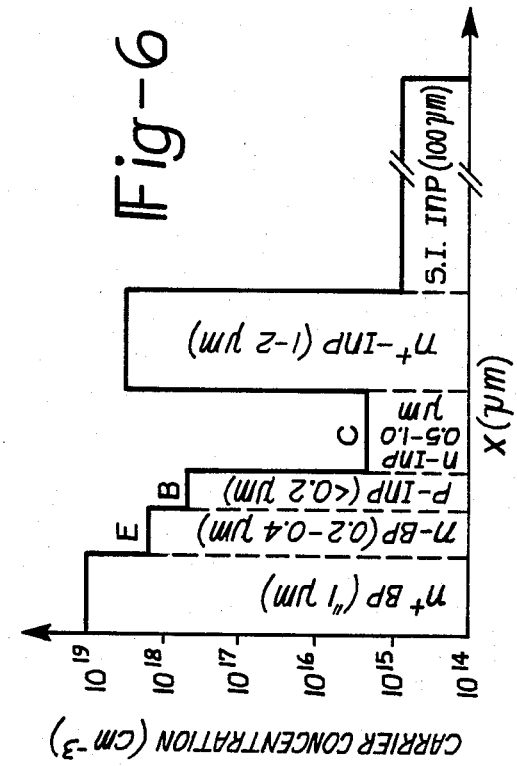
FIG. 6 is a chart showing the doping profile of the transistor.
Figure 7:
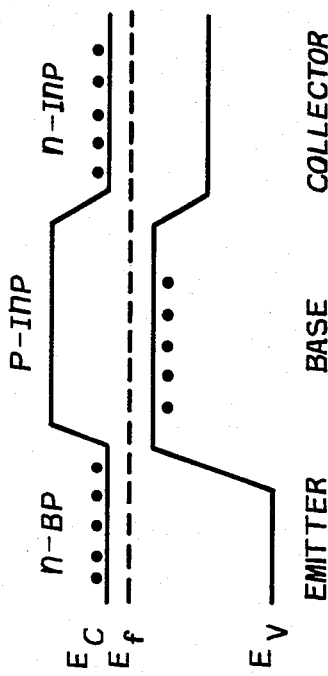
FIG. 7 is a band diagram of the transistor.

The doping profile of the different elements and regions of the transistor 10 are shown schematically in FIG. 6 while the band diagram is shown in FIG. 7.

The advantages of the indium phosphide-boron phosphide heterojunction bipolar transistor are:

1. Better control of the threshold voltage which is determined by the band gaps of the emitter and base material.

2. Higher transconductance (gm) is achieved because this parameter is controlled by the built-in junction voltage rather than layer thickness and channel doping as in MESFETs. The higher transductance (gm) provides a higher cut-off frequency for the operation of the transistor.

3. Reduced charge storage due to a short minority carrier lifetime in the indium phosphide.

4. Interconnections and small components can be easily incorporated into high density microwave integrated circuits due to self-alignment fabrication techniques.

5. The use of sub-micron thickness for the collector depletion region and base widths makes it possible to reduce the electron transit time from emitter to the collector to produce velocity overshoot phenomena. When base widths are lower than the mean free path, the carrier will travel without significant scattering in the base region. This permits the possibility of achieving ballistic transport in the indium phosphide, and leads to very high frequency performance. Any conduction band discontinuity at the indium phosphide-boron phosphide heterojunction will further accelerate the electrons towards the collector. With base and collector thicknesses of the order of the mean free path and the junction grading optimized, the transistor will have a very high cut off frequency of greater than 100 G Hz.

6. The transistor has a lower base parasitic resistance and small emitter-base capacitance. Low parasitic resistance and capacitance result in a high cut-off frequency and increased power gain.

7. Large current amplification ($B = i_C/i_B$) is achieved by precise control of the base region to make $i_B$ as small as possible.

8. Due to the high breakdown voltage and wide band gaps, the transistor has the ability to function well at high current densities during power amplification.

Having disclosed the wide band gap emitter indium phosphide-boron phosphide heterojunction transistor, it is recognized that those skilled in the art may conceive different processes and/or dopants for making the transistor without departing from the spirit of the invention as described herein and set forth in the appended claims.

Having described the invention, what is claimed is:

1. A wide gap emitter bipolar transistor structure comprising:
    a semi-insulating indium phosphide substrate;
    an n− type epitaxial indium phosphide collector layer formed on the surface of said indium phosphide substrate;
    an n+ type collector contact region disposed in said collector region;
    a p− type base region disposed in said collector layer displaced from said collector contact region;
    a n− type epitaxial boron phosphide emitter region disposed on the surface of said collector layer within said base region;
    an emitter contact region disposed over said emitter region; and
    a base contact region disposed in said collector layer adjacent to and integral with said base region.

2. The transistor structure of claim 1 further including a buried n+ layer disposed intermediate said indium phosphide substrate and said collector layer.

3. The transistor structure of claim 2 wherein said indium phosphide collector layer has a carrier concentration of approximately $2 \times 10^{15}$ cm$^{-3}$.

4. The transistor structure of claim 3 wherein said collector contact region has a carrier concentration of approximately $2 \times 10^{18}$ cm$^{-3}$.

5. The transistor structure of claim 3 wherein said base region has a carrier concentration of approximately 6 to $8 \times 10^{17}$ cm$^{-3}$.

6. The transistor structure of claims 3 or 5 wherein said base contact region has a carrier concentration greater than $10^{18}$ cm$^{-3}$.

7. The transistor structure of claim 5 wherein said boron phosphide emitter region has a carrier concentration of approximately 1 to $2 \times 10^{18}$ cm$^{-3}$.

8. The transistor structure of claim 7 wherein said emitter contact region has a carrier concentration of greater than $10^{19}$ cm$^{-3}$.

9. The transistor structure of claim 2 or 7 wherein said buried n+ layer has a carrier concentration of approximately 2 to $5 \times 10^{18}$ cm$^{-3}$.

10. The transistor structure of claim 1 where said transistor has a mesa structure and said indium phosphide layer has a discontinuity at its extremities.

11. The transistor structure of claim 1 wherein said indium phosphide layer includes a nonconductive barrier region circumscribing said collector contact region.

12. The transistor structure of claim 11 wherein said barrier region is a boron implanted region.

13. The transistor of claim 7 wherein said collector contact and base contact regions circumscribe said emitter region.

14. A wide gap emitter bipolar transistor structure comprising:
    a semi-insulating indium phosphide substrate;
    an n− type expitaxial indium phosphide collector layer formed on the surface of said substrate having a carrier concentration of approximately $2 \times 10^{15}$ cm$^{-3}$;
    a buried n+ layer disposed between said substrate and said collector layer, said n+ layer having a carrier concentration of approximately 2 to $5 \times 10^{18}$ cm$^{-3}$;
    a collector contact region formed in said collector layer having a carrier concentration of $2 \times 10^{\sim}$ cm$^3$;
    a p− indium phosphide base region formed in said collector layer and separated from said collector contact region, said base region having a carrier concentration of approximately 6 to $8 \times 10^{17}$ cm$^{-3}$;
    a p+ base contact formed in said base region having a carrier concentration greater than $10^{18}$ cm$^{-3}$;
    an n− type wide gap boron phosphide emitter disposed over said base region, said boron phosphide emitter having a carrier concentration of approximatey 1 to $2 \times 10^{18}$ cm$^{-3}$; and
    an n+ boron phosphide emitter contact region disposed over said emitter region, said emitter contact region having a carrier concentration greater than $10^{19}$ cm$^{-3}$.

15. The transistor structure of claim 14 wherein said substrate is approximately 100 micrometers thick.

16. The transistor structure of claim 14 or 15 wherein said collector layer is between 0.5 and 1.0 micrometers thick.

17. The transistor structure of claim 16 further including:
    an insulating layer disposed on the surface of the transistor having openings exposing said collector, base and emitter contact regions, and at least three metallic electrodes disposed on the surface of said insulator layer and electrically isolated from each other, each of said three electrodes individually making electrical contact with one of said collector, base and emitter contact regions through said openings.

18. An improved indium phosphide bipolar transistor having an n− type epitaxial indium phosphide collector layer disposed on a semi-insulating indium phosphide substrate and a p− type indium phosphide base region formed in said collector layer, the improvement comprising an epitaxial n− type boron phosphide emitter disposed on the surface of said p− type base region and forming a heterojunction therewith.

19. The improvement of claim 18 further including a buried n+ indium phosphide layer disposed between said collector layer and said substrate.

20. The improvement of claim 19 further including:
an n+ indium phosphide collector contact region disposed in said collector layer;
a p+ indium phosphide base contact region disposed in said base region; and
and n+ boron phosphide emitter contact region disposed on said emitter.

21. The improvement of claim 20 further including:
an insulator layer disposed on the surface of the transistor, said insulator layer having openings exposing said collector, base and emitter contact regions; and
at least three metallic electrodes disposed on the surface of insulator layer and electrically isolated from each other, each of said electrodes contacting one of said exposed collector, base and emitter contact regions through said openings.

* * * * *